United States Patent [19]

Rippey et al.

[11] Patent Number: 4,811,167
[45] Date of Patent: Mar. 7, 1989

[54] INTEGRATED CIRCUIT SOCKET

[75] Inventors: Scott R. Rippey, Parkville; Chongsoo Won, Baltimore, both of Md.

[73] Assignee: Westinghouse Electric Corp., Pittsburgh, Pa.

[21] Appl. No.: 73,608

[22] Filed: Jul. 15, 1987

[51] Int. Cl.⁴ ............................................. H05K 7/00
[52] U.S. Cl. ................................... 361/392; 338/215; 361/394; 361/400; 361/417; 361/419
[58] Field of Search ................ 174/52 FP; 200/1 R, 200/6 C, 1 G, 1 R, 1 C, 1 D, 51 R, 307, 51.07, 51.12; 338/70, 215, 219–222; 361/331, 380, 396–396, 400, 417–420

[56] References Cited

U.S. PATENT DOCUMENTS 3,880,493  4/1975  Lockhart, Jr. ................. 439/525
3,974,347  8/1976  Lockhard ........................ 200/6 C
4,168,404  9/1979  Lockhard ........................ 200/1 R
4,626,804 12/1986  Risher et al. ................... 333/22 R Primary Examiner—A. D. Pellinen
Assistant Examiner—Gregory D. Thompson
Attorney, Agent, or Firm—R. P. Lenart

[57] ABSTRACT

An integrated circuit socket is provided with an insulating member and a plurality of conductive socket pins extending from the insulating member. These socket pins are adapted to be electrically connected to the pins of an integrated circuit. A plurality of impedance elements are mechanically supported by the insulating member. Switches are provided for selectively connecting each of the impedance elements to, or isolating each of the impedance elements from, at least one of the socket pins, thereby providing the flexibility to terminate any combination of pins on the integrated circuit.

7 Claims, 5 Drawing Sheets 4,811,167

INTEGRATED CIRCUIT SOCKET

STATEMENT OF GOVERNMENT INTEREST

The United States Government has a paid-up license in this invention as provided for by the terms of Contract No. F33657-81-C-0213 awarded by the Department of Defense.

BACKGROUND OF THE INVENTION

This invention relates to integrated circuit sockets and, more particularly, to such sockets which are used with integrated logic circuits that require specific termination circuits.

Certain types of digital logic integrated circuits require specific termination circuits for satisfactory operation. For example, emitter coupled logic (ECL) and transistor transistor logic (TTL) drivers are typically terminated by a resistor or resistor network which is connected to a predetermined voltage level. Other types of termination are well known. For example, with parallel termination, the integrated circuit logic gate is connected to a junction point between two series connected resistors. With diode termination, a pair of inverse parallel diodes serve as the terminating network. In typical logic circuit board layouts, the required terminating components are provided by single in-line package resistor packs, dual in-line package resistor packs, or discrete resistors or diodes. In each case, significant amounts of printed circuit board space are required. For example, since every ECL logic gate output needs to be terminated, a large quantity of terminating components is required.

It is therefore desirable to provide an integrated circuit socket which eliminates the need for separate space consuming, circuit termination elements.

SUMMARY OF THE INVENTION

An integrated circuit socket constructed in accordance with this invention comprises an insulating member and a plurality of conductive elements extending from the insulating member. Means are provided for electrically connecting each of the conductive elements to an integrated circuit pin. A plurality of impedance elements, which serve as the required circuit terminating elements, are mechanically supported by the insulating member. Switches are provided for selectively connecting each of the impedance elements to at least one of the pins.

This invention eliminates the need for external circuit termination elements which are presently used to terminate integrated logic circuit signals, thus making available significant amounts of previously occupied printed circuit board space. Since ECL signals are best terminated at the input of the gate, and since input pins vary from chip to chip, a method of selecting the pin to which the terminating circuit element can be connected is required. Furthermore, if an integrated circuit output is fanned out to two or more inputs, termination is required at only one place. By incorporating switches into the logic circuit, a circuit designer can freely select which pins are connected to the terminating circuit elements. In the preferred embodiment, these switches are located beneath the integrated circuit package to reduce the possibility of inadvertently switching a termination in or out of the circuit after it is originally selected.

DESCRIPTION OF THE PREFERRED EMBODIMENTS

Figure 1:
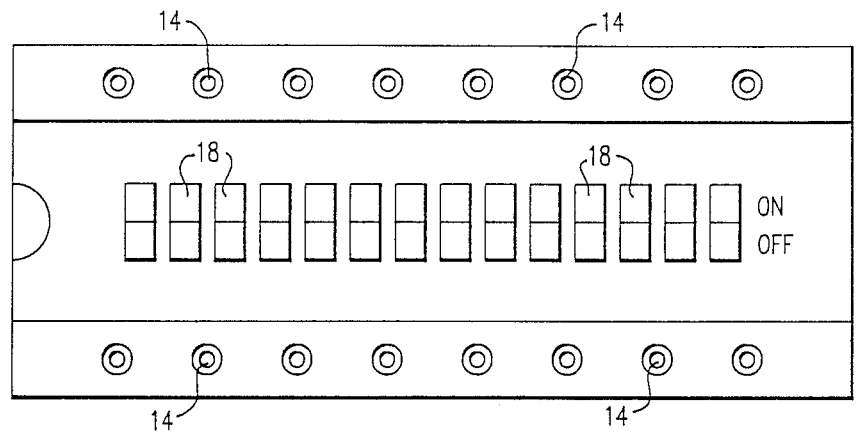
FIGS. 1, 2 and 3 are top, side and end views of an integrated circuit socket constructed in accordance with one embodiment of the present invention.
Figure 2:
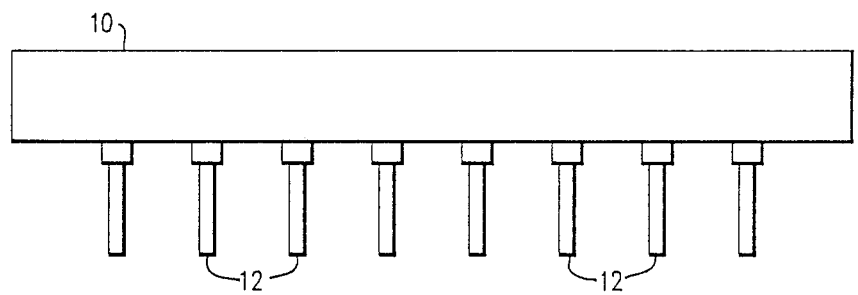
Figure 3:
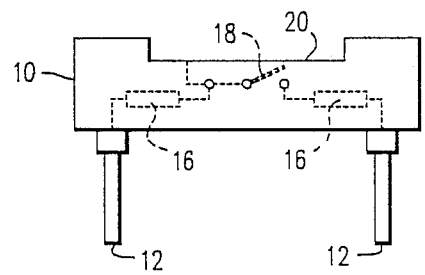

Referring to the drawings, FIGS. 1, 2 and 3 are top, side and end views of an integrated circuit socket constructed in accordance with one embodiment of this invention. The socket includes an insulating member 10 and a plurality of conductive elements in the form of socket pins 12, extending from the insulating member. These conductive elements are provided with openings 14, which serve as means for receiving the pins of an integrated circuit and for electrically connecting the integrated circuit pins to the conductive elements. A plurality of circuit terminating elements, such as resistors 16, are mechanically supported by the insulating member. Connections between these circuit terminating elements and the conductive socket pins are provided by a plurality of switches 18. These switches are mounted in a recess 20 such that when an integrated circuit is placed over the socket, the switches cannot be inadvertently switched.

Figure 4:
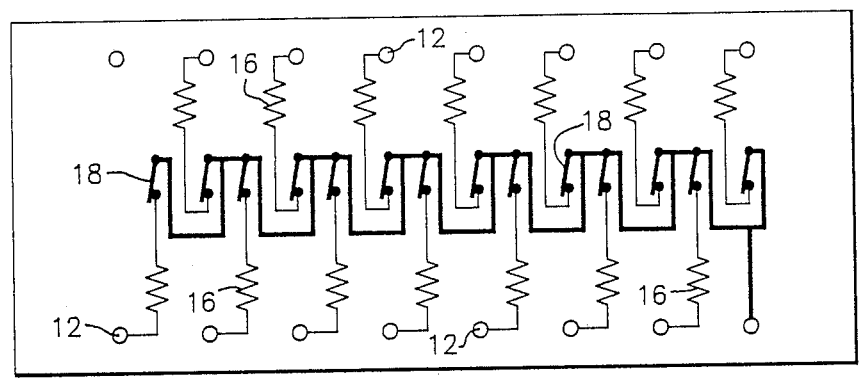
FIG. 4 is a schematic diagram of the circuit terminating elements in the socket of FIGS. 1–3.
Figure 5:
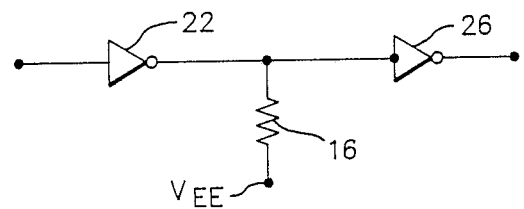
FIG. 5 is a schematic diagram which illustrates the resistive circuit termination provided by the circuit of FIG. 4.

FIG. 4 is a schematic diagram of the termination circuit provided by the socket of FIGS. 1–3. Switches 18 can be opened or closed to selectively connect or disconnect the terminating resistors 16 to the socket pins 12. As illustrated in FIG. 5, this socket can provide the most common type of ECL termination, which is called series termination. In this case, the terminating resistor 16 is electrically connected in series between the predetermined supply voltage $V_{EE}$ and a junction point between the output of an integrated circuit logic gate 22 and the input of logic gate 26.

Figure 6:
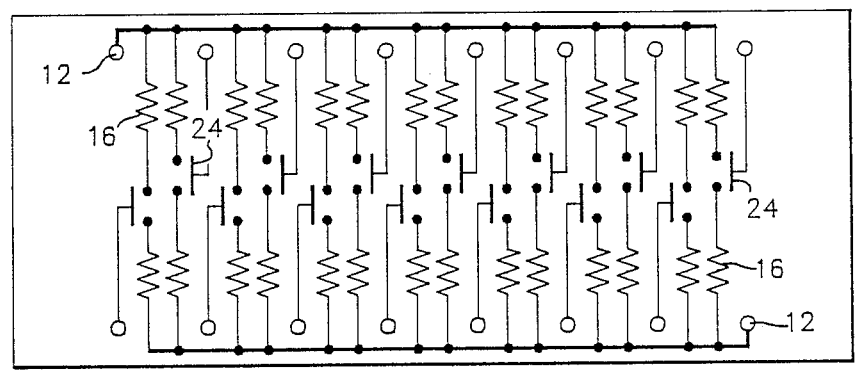
FIG. 6 is a schematic diagram of the circuit termination elements provided by the socket of FIGS. 1–3.
Figure 7:
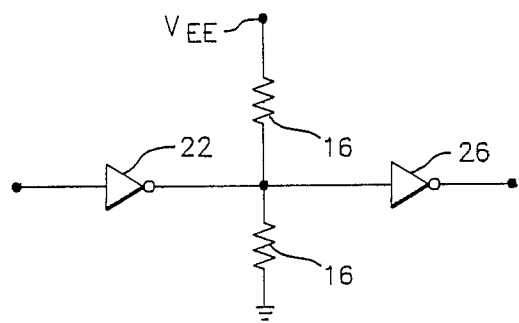
FIG. 7 is a schematic diagram which illustrates the parallel termination provided by the circuit of FIG. 6.

FIG. 6 includes a greater number of resistors 16 and single pole double throw switches 24 to make the required circuit connections. By making internal connections between the terminating resistors as illustrated in the schematic diagram of FIG. 6, this socket can provide the termination circuit illustrated in FIG. 7, which is typically called a parallel termination. With this type of termination, a pair of terminating resistors are electrically connected in series, and the input of a logic gate 26 and the output of logic gate 22 are connected to the junction point between these resistors. The resistors form a circuit branch which is connected between a predetermined voltage level $V_{EE}$ and ground.

Figure 8:
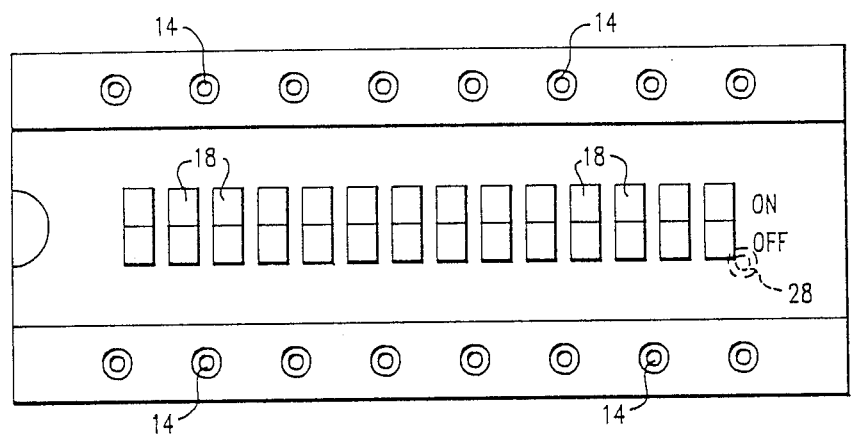
FIGS. 8 and 9 are top and end views of another alternative embodiment of the present invention.
Figure 9:
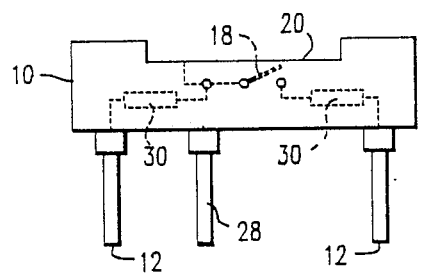
Figure 10:
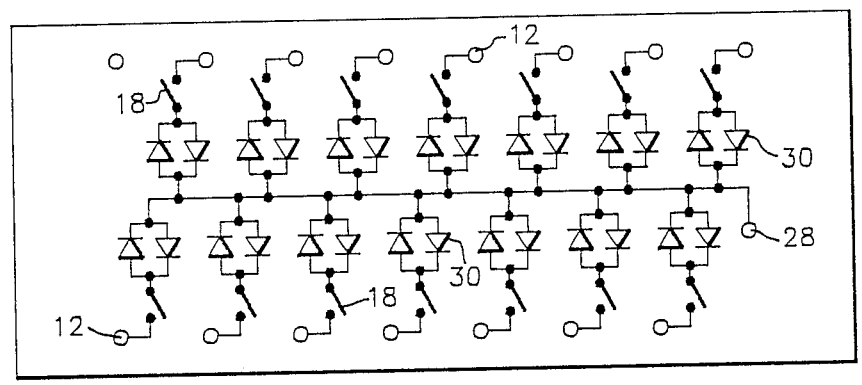
FIG. 10 is a schematic diagram of the terminating circuit provided by the socket of FIGS. 5–9.
Figure 11:
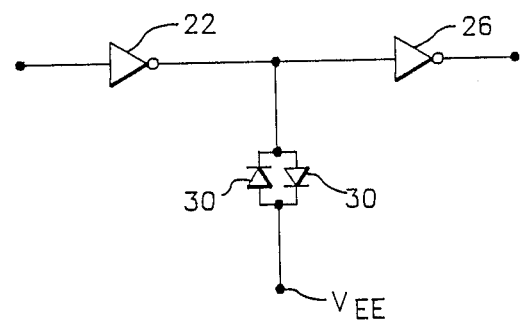
FIG. 11 is a schematic diagram which illustrates the diode termination provided by the circuit of FIG. 10.

FIGS. 8 and 9 show top and end views of another alternative embodiment of the present invention. With this embodiment it is apparent that an additional socket pin 28 has been added. A plurality of diodes 30 are electrically connected in inverse parallel pairs as illustrated in FIG. 10. This socket is used to provide the diode termination circuit illustrated in FIG. 11.

In each of the illustrated embodiments, the terminating circuit elements are embedded in the insulating member. Miniature rocker switches are used to give a circuit designer the flexibility to terminate any combination of pins from a typical integrated circuit package. These switches are preferably mounted on top of the socket such that they will be below the integrated circuit package when its pins are inserted into the socket. This will prevent inadvertent switching of the terminating elements.

It should therefore be apparent that the sockets of the present invention can conserve valuable printed circuit board space by incorporating the necessary circuit terminating elements. It is preferable to manufacture these sockets with a low profile such that a simple tradeoff of horizontal board space to vertical space is not necessary.

Although the present invention has been described in terms of what are at present believed to be its preferred embodiments, it will be apparent to those skilled in the art that various changes may be made without departing from the scope of the invention. It is therefore intended that the appended claims cover such changes.

What is claimed is:

1. An integrated circuit socket comprising:
   an insulating member;
   a plurality of conductive elements extending from said insulating member;
   means including an opening in each of said conductive elements for electrically connecting each of said conductive elements to an integrated circuit pin;
   a plurality of impedance elements mechanically supported by said insulating member; and
   a plurality of switches, mechanically supported by said insulating member, for selectively connecting each of said impedance elements to, or selectively isolating each of said impedance elements from, at least one of said pins.

2. An integrated circuit socket as recited in claim 1, wherein said impedance elements are embedded in said insulating member.

3. An integrated circuit socket as recited in claim 1, wherein said impedance elements are resistors.

4. An integrated circuit socket as recited in claim 1, wherein said impedance elements are inverse parallel diode pairs.

5. An integrated circuit socket as recited in claim 1, wherein each of said impedance elements is permanently electrically connected to a single one of said conductive elements.

6. An integrated circuit socket as recited in claim 1, wherein said conductive elements extend from a first side of said insulating member and said switches are mounted on an opposite side of said insulating member.

7. An integrated circuit socket as recited in claim 6, wherein:
   said insulating member includes a groove in said opposite side; and
   said switches are mounted within said groove.

* * * * *